(12) United States Patent
Oertle et al.

(10) Patent No.: US 7,521,965 B2
(45) Date of Patent: *Apr. 21, 2009

(54) 5 VOLT TOLERANT IO SCHEME USING LOW-VOLTAGE DEVICES

(75) Inventors: Kent Oertle, Phoenix, AZ (US); Robert Elio, Mesa, AZ (US); Duncan McFarland, Tempe, AZ (US); Darrin Benzer, Chandler, AZ (US)

(73) Assignee: Broadcom Corporation, Irvine, CA (US)

( * ) Notice: Subject to any disclaimer, the term of this patent is extended or adjusted under 35 U.S.C. 154(b) by 334 days.

This patent is subject to a terminal disclaimer.

(21) Appl. No.: 11/051,146

(22) Filed: Feb. 4, 2005

(65) Prior Publication Data

US 2005/0127953 A1  Jun. 16, 2005

Related U.S. Application Data

(63) Continuation of application No. 10/370,392, filed on Feb. 19, 2003, now Pat. No. 6,856,168.

(60) Provisional application No. 60/402,771, filed on Aug. 12, 2002.

(51) Int. Cl.
*H03K 19/0175* (2006.01)

(52) U.S. Cl. .......................... 326/83; 326/81

(58) Field of Classification Search .............. 326/80–87
See application file for complete search history.

(56) References Cited

U.S. PATENT DOCUMENTS

| | | | |
|---|---|---|---|
| 5,534,795 A | 7/1996 | Wert et al. | 326/81 |
| 5,543,733 A | 8/1996 | Mattos et al. | 326/81 |
| 5,721,508 A | 2/1998 | Rees | 327/382 |
| 5,825,206 A | 10/1998 | Krishnamurthy et al. | 326/81 |
| 6,018,257 A | 1/2000 | Hung et al. | 327/112 |
| 6,028,450 A * | 2/2000 | Nance | 326/81 |
| 6,081,412 A | 6/2000 | Duncan et al. | 361/86 |
| 6,118,301 A * | 9/2000 | Singh et al. | 326/58 |
| 6,130,556 A | 10/2000 | Schmitt et al. | 326/81 |
| 6,265,926 B1 | 7/2001 | Wong | 327/318 |
| 6,388,469 B1 | 5/2002 | Hunt et al. | 326/81 |
| 6,388,470 B1 * | 5/2002 | Mattos et al. | 326/81 |
| 6,414,515 B1 * | 7/2002 | Kunz et al. | 326/81 |
| 6,628,149 B2 * | 9/2003 | Ajit | 327/108 |
| 6,803,789 B1 * | 10/2004 | Yu et al. | 326/81 |

FOREIGN PATENT DOCUMENTS

EP    0 862 267    9/1998

* cited by examiner

*Primary Examiner*—Don P Le
(74) *Attorney, Agent, or Firm*—McAndrews Held & Malloy Ltd.

(57) ABSTRACT

Systems and methods are disclosed for operating a core circuitry of an integrated circuit at a lower voltage than the coupled IO circuitry using a tolerant circuit. In one embodiment includes a voltage tolerant circuit comprising a voltage detect module adapted to detect when a voltage is sufficient to switch bias conditions without violating maximum transistor operating conditions and a comparator adapted to detect when a PAD voltage is greater than an IO power supply voltage.

21 Claims, 10 Drawing Sheets

5 VOLT TOLERANT IO SCHEME USING LOW-VOLTAGE DEVICES

CROSS-REFERENCE TO RELATED APPLICATIONS

This application is a continuation of U.S. application Ser. No. 10/370,392 filed Feb. 19, 2003, titled "5 Volt Tolerant IO Scheme Using Low-Voltage Devices", now U.S. Pat. No. 6,856,168 issued Feb. 15, 2005, which is related to, and claims benefit of and priority from, Provisional Application No. 60/402,771 dated Aug. 12, 2002, titled "5 Volt Tolerant IO Scheme Using Low-Voltage Devices", the complete subject matter of each of which is incorporated herein by reference in its entirety.

FEDERALLY SPONSORED RESEARCH OR DEVELOPMENT

Not Applicable

SEQUENCE LISTING

Not Applicable

MICROFICHE/COPYRIGHT REFERENCE

Not Applicable

BACKGROUND OF THE INVENTION

The present invention relates to a voltage tolerant circuit device or method. More specifically, the present invention relates to a 5V tolerant IO scheme using low voltage devices adapted to adjust bias conditions.

In modern CMOS ASIC design, the core circuitry generally operates at a lower voltage than the IO circuits. This provides a core circuitry design that operates at higher speeds with lower power consumption than previous circuitry designs. However, since the maximum operating voltage of such current CMOS ASIC core circuitry designs is also lower, these devices may not be used directly with currently known IO circuits without special design considerations.

This limitation may be further complicated when the maximum device voltage is significantly less than the voltage required for 5V tolerance. Smaller device geometries result in higher device efficiencies, but at the same time lower the maximum device voltage. A design method is contemplated that enables IO devices to utilize more efficient transistors without violating the transistor maximum voltage, enabling other circuitry to benefit from the increased transistor efficiencies.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Features of the present invention may be found in a system and/or method for enabling IO devices in a CMOS ASIC design to utilize more efficient transistors while not violating the transistor maximum voltage, substantially as shown in and/or described in connection with at least one of the figures, as set forth more completely in the claims.

These and other advantages and novel features of the present invention, as well as details of an illustrated embodiment thereof, will be more fully understood from the following description and drawings.

DETAILED DESCRIPTION OF THE INVENTION

The following description is made with reference to the appended figures.

Figure 1:
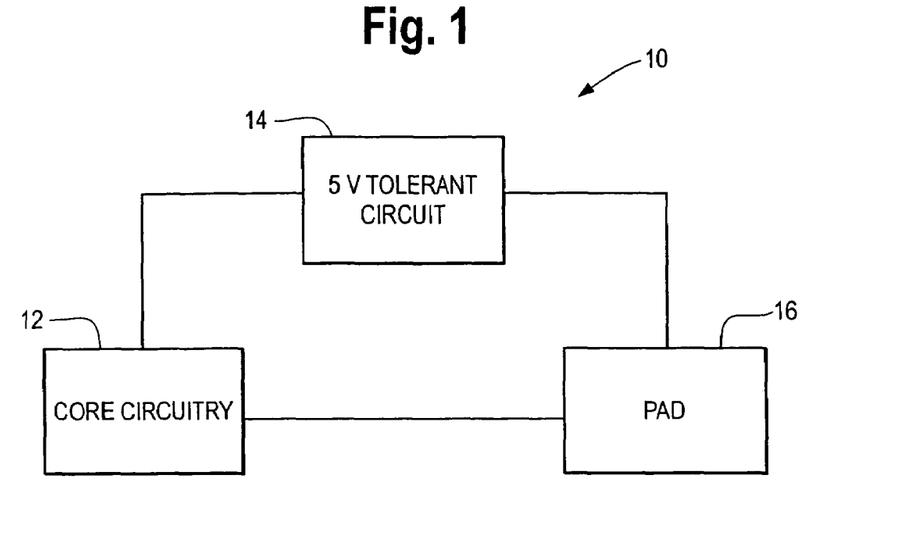
FIG. 1 illustrates a block diagram of one embodiment of a integrated circuit in accordance with the present invention.

FIG. 1 illustrates a block diagram of one embodiment of an integrated circuit, generally designated 10, in accordance with the present invention. In the illustrated embodiment, the integrated circuit 10 comprises at least core circuitry 12 and PAD 16 adapted to be coupled to, and driven by, external circuitry via a bus (not shown).

In CMOS design, the core circuitry 12 generally operates at a lower voltage than the PAD voltage. For example, a high voltage (about 5.5V) may be applied to the PAD 16, but a lower voltage (less than about 3.3V, for example 2.5V) is applied across the junctions in the core circuitry 12. In this embodiment, a 5V tolerant circuit or module, generally designated 14, is illustrated coupled to both the core circuitry 12 and the PAD 16. The 5V tolerant circuit 14 is adapted to enable the core circuitry to utilize more efficient transistors (for example using 2.5V transistor devices, rather than 3.3V transistor devices, which are more efficient for analog applications) without violating the transistor maximum voltage. An exemplary embodiment of the circuit 14 enables the core circuitry 12 to operate at a lower voltage (2.5V for example) than the PAD voltage by changing the transistor bias voltage based on the PAD voltage.

Figure 2:
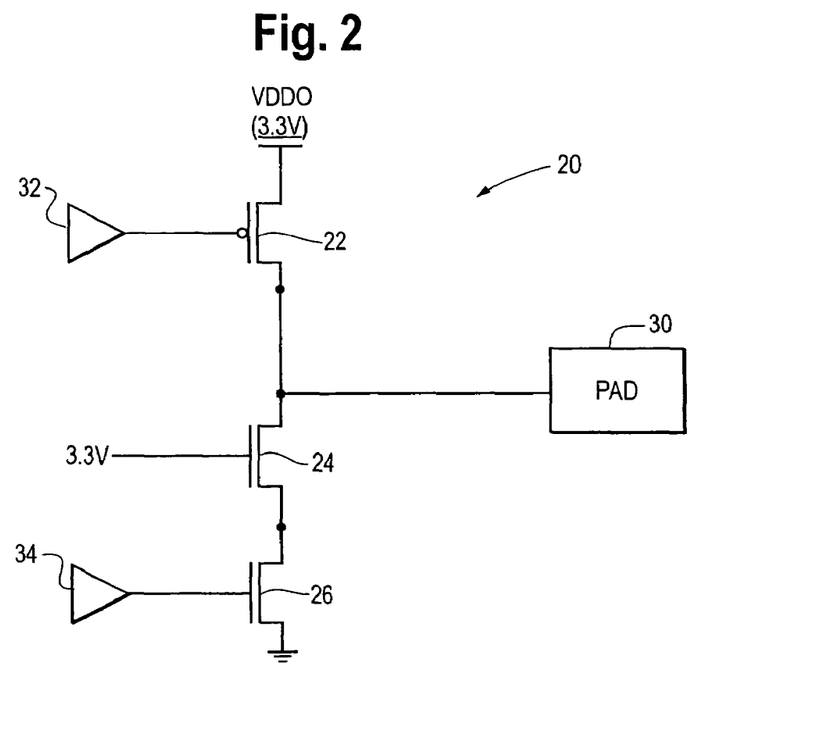
FIG. 2 illustrates a circuit diagram of one example of an core circuit having a PAD.

FIG. 2 illustrates one example of an existing 5V tolerant circuit 20 comprising three transistor devices, one PMOS device 22 and two NMOS devices 24 and 26, which, in this example, form sensitive IC core logic circuit. A tri-stated bi-directional PAD 30 is shown coupled to at least devices 22 and 26. It is contemplated that the PAD 30 is coupled to, and driven by, external circuitry via a bus (not shown). Two pre-driver devices 32 and 34 are illustrated, coupled to PMOS device 22 and NMOS device 26. It is contemplated that, in this embodiment, device 22 is a floating well transistor device.

Figure 3:
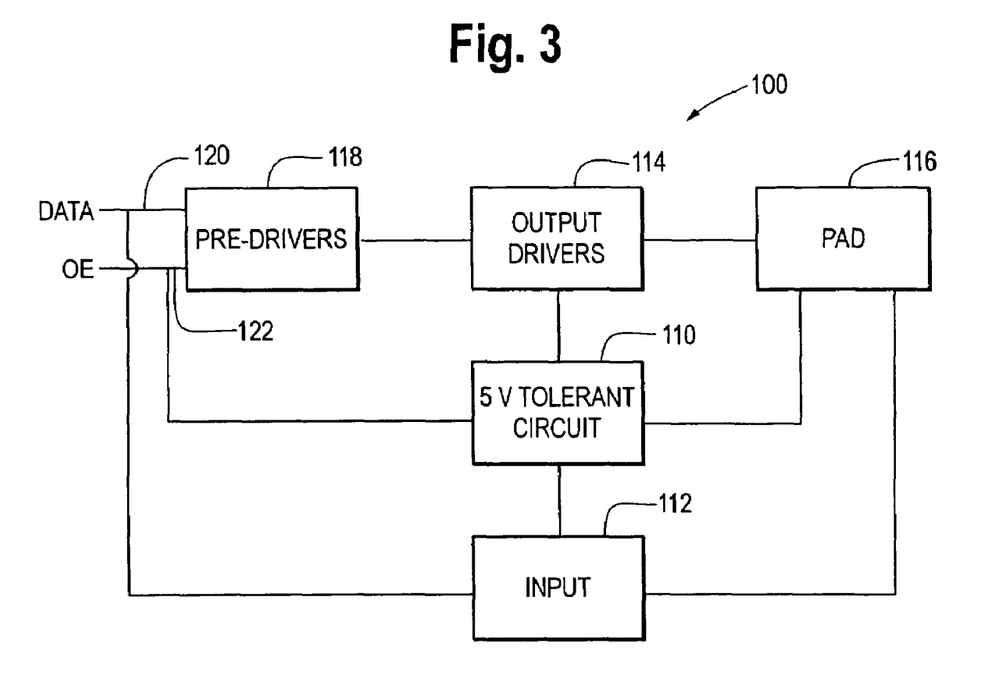
FIG. 3 illustrates one embodiment of a block diagram of circuit using a 5V tolerant circuit or module in accordance with the present invention.

FIG. 3 illustrates one embodiment of a block diagram of circuit, generally designated 100, using a 5V tolerant circuit or module 110 in accordance with the present invention. In this embodiment, the present invention is adapted to switch nodes (switch gate node voltages for example) in the circuit depending on the voltage of PAD 116. FIG. 3 illustrates the 5V tolerant module 110 is coupled to input circuit or module 112, output driver circuit or module 114 and the PAD 116. Further, circuit 100 comprises a pre-driver circuit or module 118 coupled to the output driver module 114. In this embodiment, circuit 100 has at least two nodes, data node 120 and output enable node 122, coupled to at least the predriver module 118 and the 5V tolerant module 110.

In one embodiment of the present invention, circuit 100 is adapted to drive the PAD when the output enable node 122 is enabled, where the voltage of the PAD 116 follows the data node 120; and an external bus drives the PAD when the enable node 122 is not enabled as illustrated in Table 1 as follows:

TABLE 1

| Output Enable | DATA | PAD |
|---|---|---|
| 1 | 0 | 0 |
| 1 | 1 | 1 |
| 0 | 0 | Z |
| 0 | 1 | Z |

Table 1 illustrates that, when the output enable node is enabled, the voltage of the PAD follows the data node. For example, when the output enable node is enabled, PAD is high when the data node is high, but the PAD is low when the data node is low. However, when the output enable node is not enabled, the PAD is tristated, so where the PAD is driven by an external bus. In one embodiment, the external bus traverses between 5V and ground.

Figure 4:
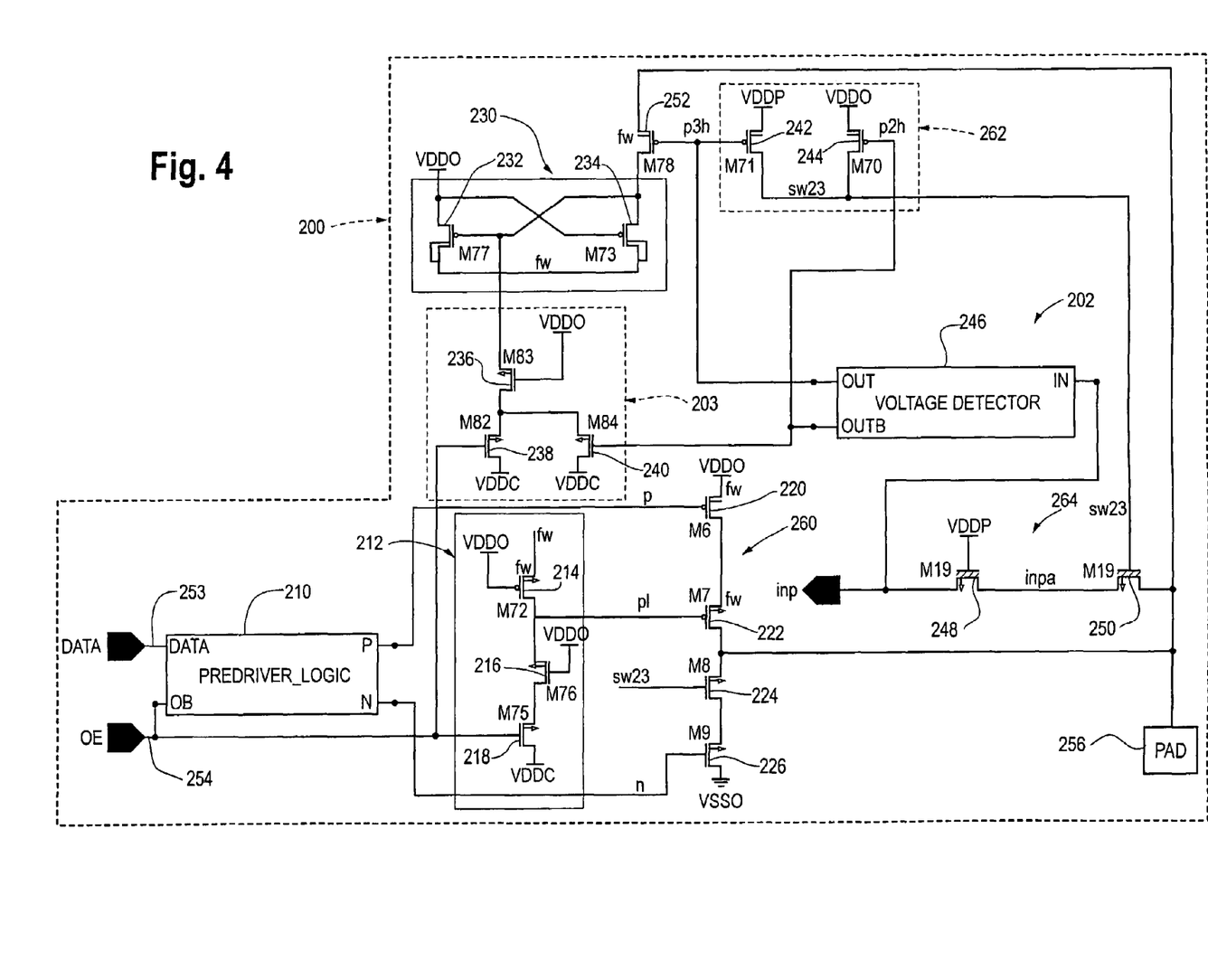
FIG. 4 illustrates one embodiment of a circuit diagram of a portion of an integrated circuit using a 5V tolerant circuit in accordance with the present invention.

One embodiment of an integrated circuit, generally designated 200, is illustrated in FIG. 4. In accordance with the present invention, this embodiment comprises at least a voltage detect circuit or module, generally designated 202, adapted to detect when a voltage is sufficient to switch the bias conditions without violating the maximum transistor operating conditions for the process; a comparator or comparator circuit or module, generally designated 230, adapted to determine when the PAD voltage is greater than the IO power supply voltage; a switching transistor device or module 262; input circuit or module 264; a tri-state circuit or module 212 adapted to ensure one or more device(s) coupled to at least the PAD will not turn on when the PAD voltage exceeds the IO power supply voltage: an overstress prevention circuit, 203, designed to prevent overstress when the output is disabled and the pad is driven to 5V.

In accordance with one embodiment, an overstress circuit or module, generally designated 203, prevents overstressing devices 238 and 240 of the circuit 200 when the floating well (alternatively referred to as "fw") is greater than or equal to the higher of the PAD voltage or the highest voltage in the circuit (i.e., VDDO). In one embodiment, the overstress circuit 203 may prevent such overstress enabling the source of device 236 to rise to VDDO–$V_t$ (the threshold of an NMOS device), when node fw>VDDO. In this embodiment, the overstress circuit 203 comprises at least one, but generally three, transistor devices, such as three NMOS or n-channel transistor devices 236, 238 and 240 for example.

In the illustrated embodiment, the voltage detect circuit 202 is adapted to detect when a voltage is sufficient to switch the bias conditions without violating maximum transistor operating conditions for the process. In the circuit 200 illustrated in FIG. 3, the voltage detect circuit comprises a voltage detect device 246 having an input coupled to device 248 and node "inp", an output labeled "out" coupled to node p3$h$, and PMOS devices 242 and 252, and output labeled "outb" coupled to NMOS device 240 and PMOS device 244. In this embodiment, it is contemplated that the voltage detect device 246 is adapted to determine whether the PAD voltage is high or low (i.e., in one embodiment the input node inp and output node p3$h$ of the detect device 246 are the same logic state and output node p2$h$ is the opposite logic state of output node p3$h$).

The integrated circuit 200 also comprises the comparator circuit or module 230 adapted to determine when the PAD voltage is greater than the IO power supply voltage. In this embodiment, the comparator 230 comprises at least one, but generally two or more devices, such as two PMOS or p-channel transistor devices 232 and 234 for example.

This embodiment further comprises tri-state circuit or module 212 adapted to guarantee that a device, such as a PMOS or p-channel transistor device 222 for example, will not turn on when the PAD voltage exceeds the IO power supply voltage. In this embodiment, the tri-state circuit 212 comprises at least one, but generally three, devices, such as a PMOS or p-channel transistor device 214 and two NMOS or n-channel transistor devices 216 and 218.

One embodiment of the present invention comprises at least one, but generally two or more power supplies. Such power supplies may be externally supplied or generated internally. In the illustrated embodiment, three power supplies are contemplated; the core power supply or VDDC, the intermediate power supply, or VDDP, and the IO power supply or VDDO. VDDP is set to the maximum IO device voltage (i.e., less than VDDO for example). It is contemplated that utilizing 3 power supplies, limits the maximum voltage across any device, maintaining gate oxide reliability and avoiding hot carrier injection (alternatively referred to as "HCI").

The circuit 200 further comprises a node sw23, coupled to at least one but generally two or more devices, PMOS or p-channel transistor 242 and 244 for example. Node sw23 and devices 242 and 244 are adapted to pull the gates of the transistor devices 224 and 250 to VDDO if the PAD voltage is high, and to VDDP if the PAD voltage is low. PAD 256 is illustrated coupled to transistor device 250 and to sw23 through circuit 202 and devices 242 and 244.

The circuit 200 further comprises a pre-driver logic device 210, which is adapted to generate one or more logic states that drive the stacked output devices, 220 and 226. The pre-driver logic device 210 is coupled to nodes 253 (alternatively referred to as "data") and node 254 (alternatively referred to as "oe" or "output enable"), and the gates of the stacked output devices, 220 and 226. In this embodiment, nodes data and oe are coupled from the core circuitry (not shown). Further, the output device circuit or module 260 comprise at least one, but generally two or more transistor devices, for example two PMOS transistor devices 220 and 222, and two NMOS devices 224 and 226, where devices 222 and 224 are coupled to the PAD 256.

In one embodiment of the present invention, node oe drives the gate of transistor device 238 to a high state (i.e, oe=1), turning device 238 on. Turning on device 238 pulls down the gate of transistor device 232, turning device 232 on, and pulling node fw to VDDO. It is contemplated that this may ensure that the PAD voltage never exceeds the voltage on fw. Node oe 254 drives the gate of transistor device 218 turning device 218 on. Turning device 218 on pulls the node pt to VDDC. When node pt reaches VDDC, PAD 256 may switch between VSSC and VDDO without causing overstress on transistor device 222.

When node oe 254 is enabled and node data 253 is low (i.e., oe=1 and data=0), transistor device 220 is off and 222 is off while transistor devices 224 and 226 are turned on. This drives the PAD voltage to VSSC. The PAD voltage is communicated or fed back through the voltage detector 246, resulting in nodes p3h being pulled to VDDC and p2h being pulled to VDDO.

When node p3h reaches VDDC, transistor device 242 is turned on and node sw23 is pulled to VDDP. When node sw23 reaches VDDP, the gate of transistor devices 250 and 224 are driven to VDDP, lowering the voltage across transistor devices 250 and 224 when the PAD Voltage is driven to VSSC. In one embodiment of the present invention, transistor device 252 decouples the PAD 256 (and the PAD voltage) from the gate of transistor device 232 when the PAD voltage is less than VDDO+Vt. This prevents overstress on transistor device 232 when the PAD voltage is driven to VSSC. Transistor device 232 is used to pull node fw to VDDO when node oe 254 is enabled (i.e., oe=1). Transistor devices 238 and 236 are added to pull the gate of transistor device 232 to VDDC when node oe is enabled, preventing overstress on device 232.

In addition to turning devices 238, 232 and 218 on, pulling node fw to VDDO, and node pt to VDDC as provided above, when nodes oe 254 and data 253 are both enabled (i.e., oe=1 and data=1), transistor device 224 is on and 226 is off and transistor devices 220 and 222 are turned on. Turning on devices 220 and 222 drives the PAD voltage to VDDO. The PAD voltage is communicated or fed back through the voltage detector 246, resulting in node p3h being driven to VDDO and node p2h being driven to VDDC. When node p2h reaches VDDC, transistor device 244 is turned on and node sw23 is driven to VDDO. When node sw23 reaches VDDO, the gates of devices 250 and 224 are driven to VDDO, lowering the voltage across transistor devices 250 and 224 when PAD is driven to VDDO.

In one embodiment of the present invention, node oe 254 drives the gate of transistor devices 238, turning device 238 on or off. When node oe 254 is not enabled (i.e., oe=0), transistor devices 218 and 238 are off. Transistor devices 224, 226, 220, 222 and hence the PAD node are driven to a high impedance state. The PAD node may, in this embodiment, be driven by an external bus.

In addition to driving devices 226, 220 and 222 and the PAD node to high impedance state, when node oe 254 is low and the PAD Voltage is 0 (i.e., oe=0 and PAD=0), the bus drives PAD 256 to VSSC. The PAD voltage is communicated or fed back through the voltage detector 246 resulting in node p3h being driven to VDDC and node p2h being driven to VDDO. When node p3h reaches VDDC, transistor device 242 is turned on and node sw23 is driven to VDDP. Node sw23 drives the gates of devices 250 and 224 to VDDP, lowering the voltage across devices 250 and 224 when the PAD Voltage is driven to VSSC. When node p2h is driven to VDDO, it turns on the device 240 pulling the gate of transistor device 232 low. Pulling the gate of device 232 low turns it on, pulling node fw to VDDO.

In addition to driving devices 226, 220 and 222 and the output to high impedance state, when node oe 224 is not enabled (i.e., oe=0) and the bus drives the PAD voltage to VDDO, the PAD voltage is communicated or fed back through the voltage detector 246. This results in node p3h being driven to VDDO and node p2h being driven to VDDC. When p3h reaches VDDO, transistor device 244 is turned on and sw23 is driven to VDDO. Node sw23 drives the gates of transistor devices 250 and 224 to VDDO, lowering the voltage across devices 250 and 224 when the bus drives the PAD voltage to VDDO. In this embodiment, node fw floats between VDDO±Vt, clamped by the turn on of devices 234 and 252, and the source to bulk fw diode of device 222.

In addition to driving devices 226, 220 and 222 and the output to a high impedance state, when node oe 254 is not enabled (i.e., oe=0) and the bus drives the PAD voltage to >VDDO, the PAD voltage is communicated or fed back through the voltage detector 246. This results in node p3h being driven to VDDO and node p2h being driven to VDDC. When node p3h reaches VDDO, transistor device 244 is turned on and node sw23 is driven to VDDO. Node sw23 drives the gates of transistor devices 250 and 224 to VDDO, lowering the voltage across devices 250 and 224 when the bus drives PAD voltage to VDDO. As illustrated, PAD 256 is coupled to transistor device 252. Device 252 turns on when PAD Voltage is at >VDDO+Vt and the gate of device 252 is at VDDO, which pulls the gate of transistor device 232 to the PAD voltage, turning off device 232, turning on device 234 and pulling node fw to PAD. When node fw reaches VDDO+Vt, transistor device 214 turns on, pulling node pt to the fw node or the PAD voltage. This prevents voltage stress on device 222 and keeps node PAD in high impendance state.

FIGS. 5A, 5B, 5C, 6A, 6B, 6C and 6D illustrate methods of operating a core circuit of an integrated circuit at a lower voltage than the coupled IO circuitry using a voltage tolerant circuit in accordance with the present invention. In accordance with one embodiment, the method comprises using a voltage tolerant circuit (a 5V tolerant circuit for example) to prevent overstress on at least one device of a circuit when the floating well or fw equal to the higher of the PAD voltage or the highest voltage in the circuit (VDDO for example).

It is contemplated that the voltage tolerant circuit operates in one or more possible operating conditions. In one embodiment, the voltage tolerant circuit operates in five possible operating conditions: (1) the output is enabled but the data is low (i.e., oe=1 and data=0); (2) the output is enabled but the data is high (i.e., oe=1 and data=1); (3) the output is not enabled and the PAD Voltage is low (i.e., oe=0 or tri-stated and PAD=0); (4) the output is not enabled and the PAD Voltage is VDDO±Vt (i.e., oe=0 or tri-stated and PAD=VDDO; and (5) the output is not enabled and the PAD Voltage is greater than VDDO+Vt (i.e., oe=1 or tri-stated and PAD>VDDO+Vt). Details for each of these possible operating conditions are provided below.

Figure 5A:
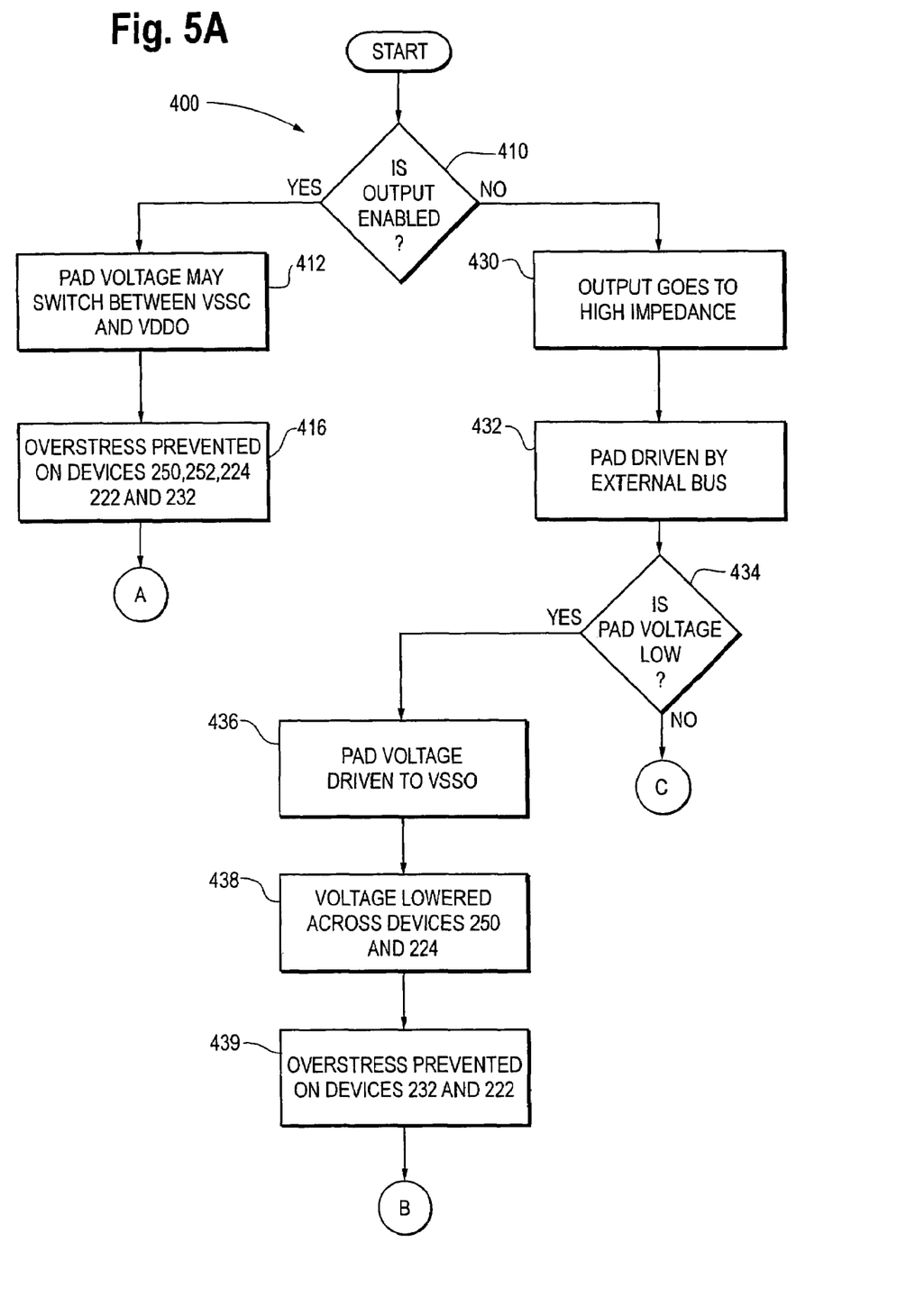
FIGS. 5A, 5B and 5C illustrate one embodiment of a high level flow chart of one method of operating a circuit at a lower voltage than the coupled IO circuitry in accordance with the present invention.
Figure 5B:
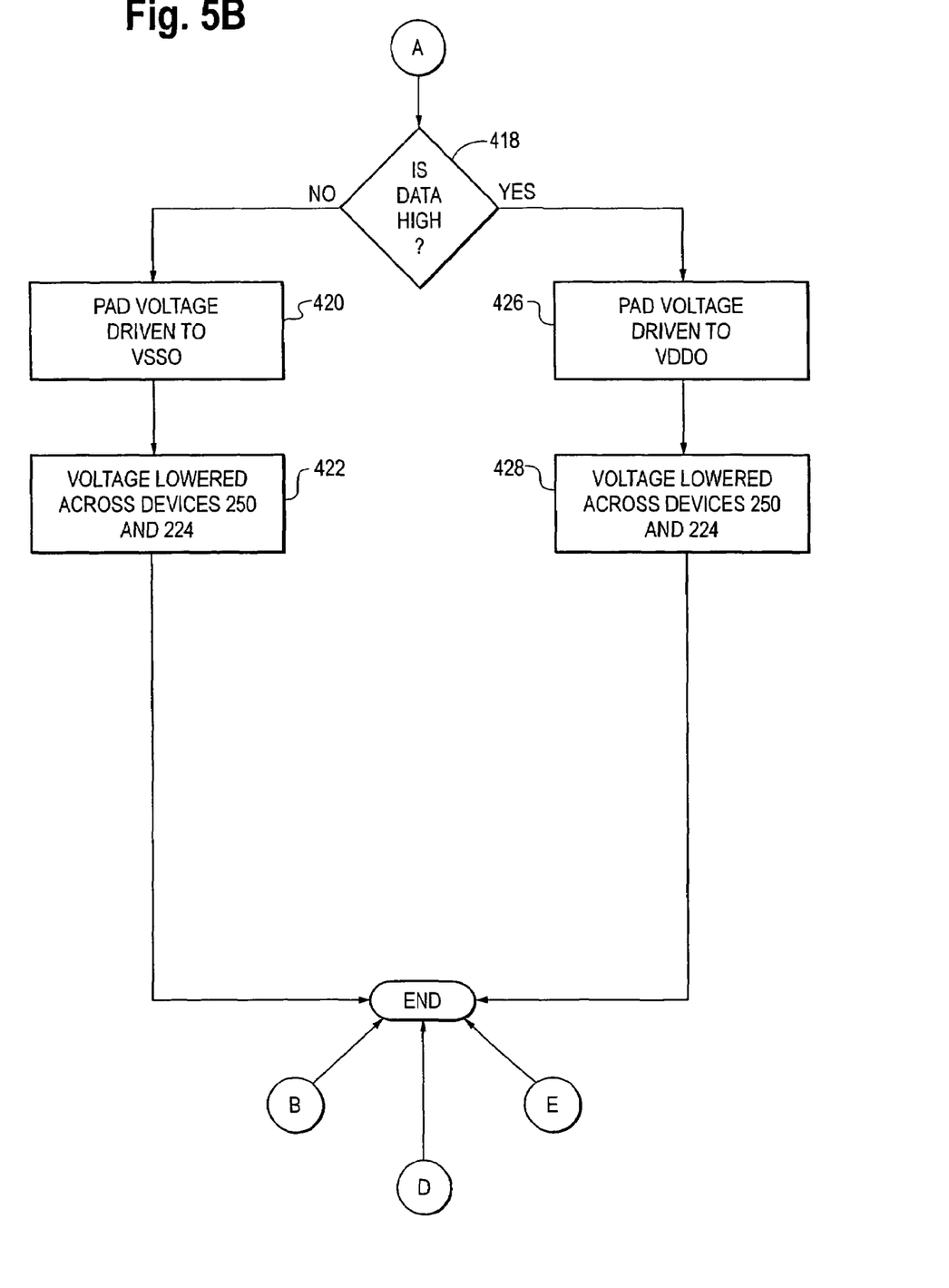
Figure 5C:
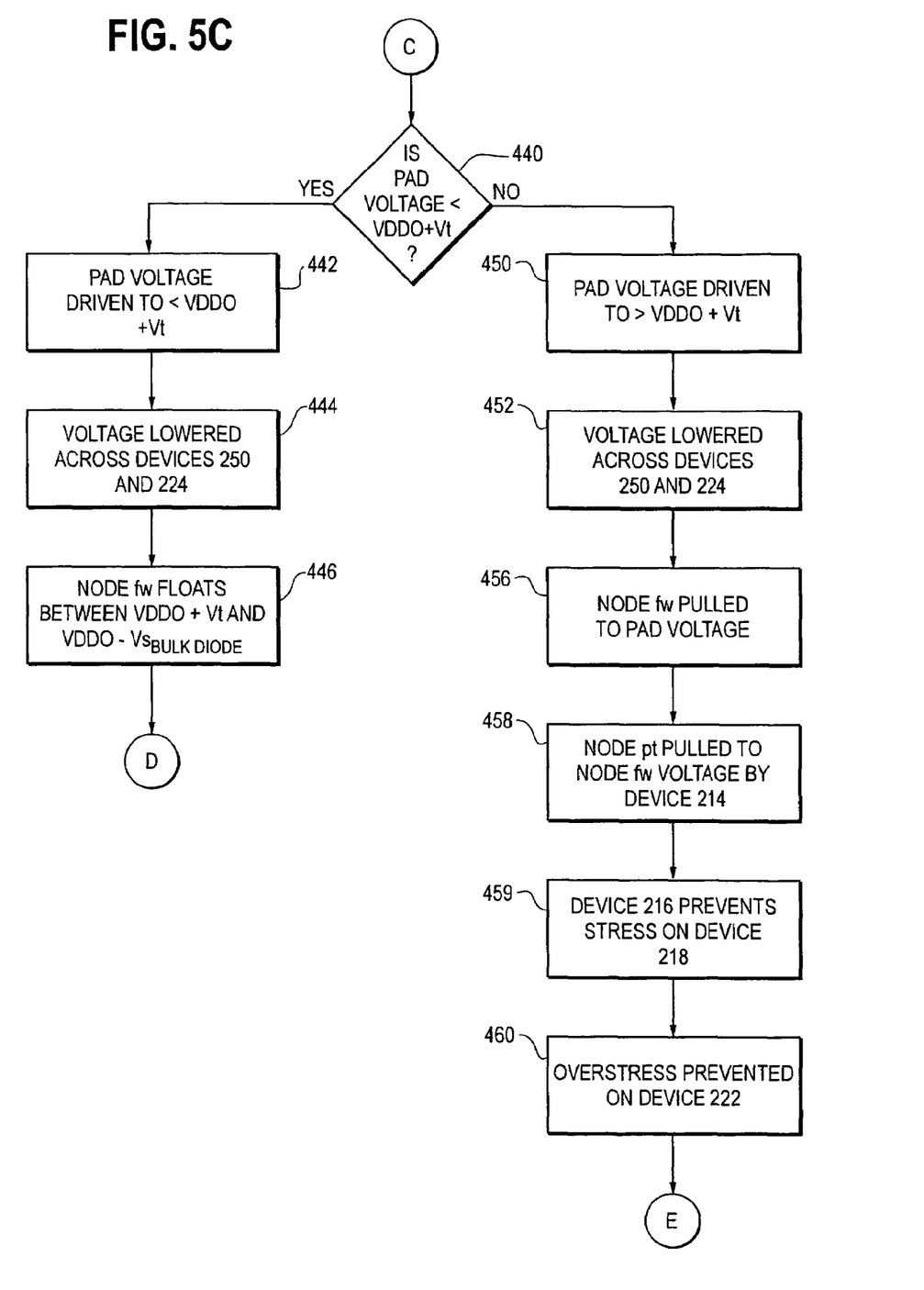
Figure 6A:
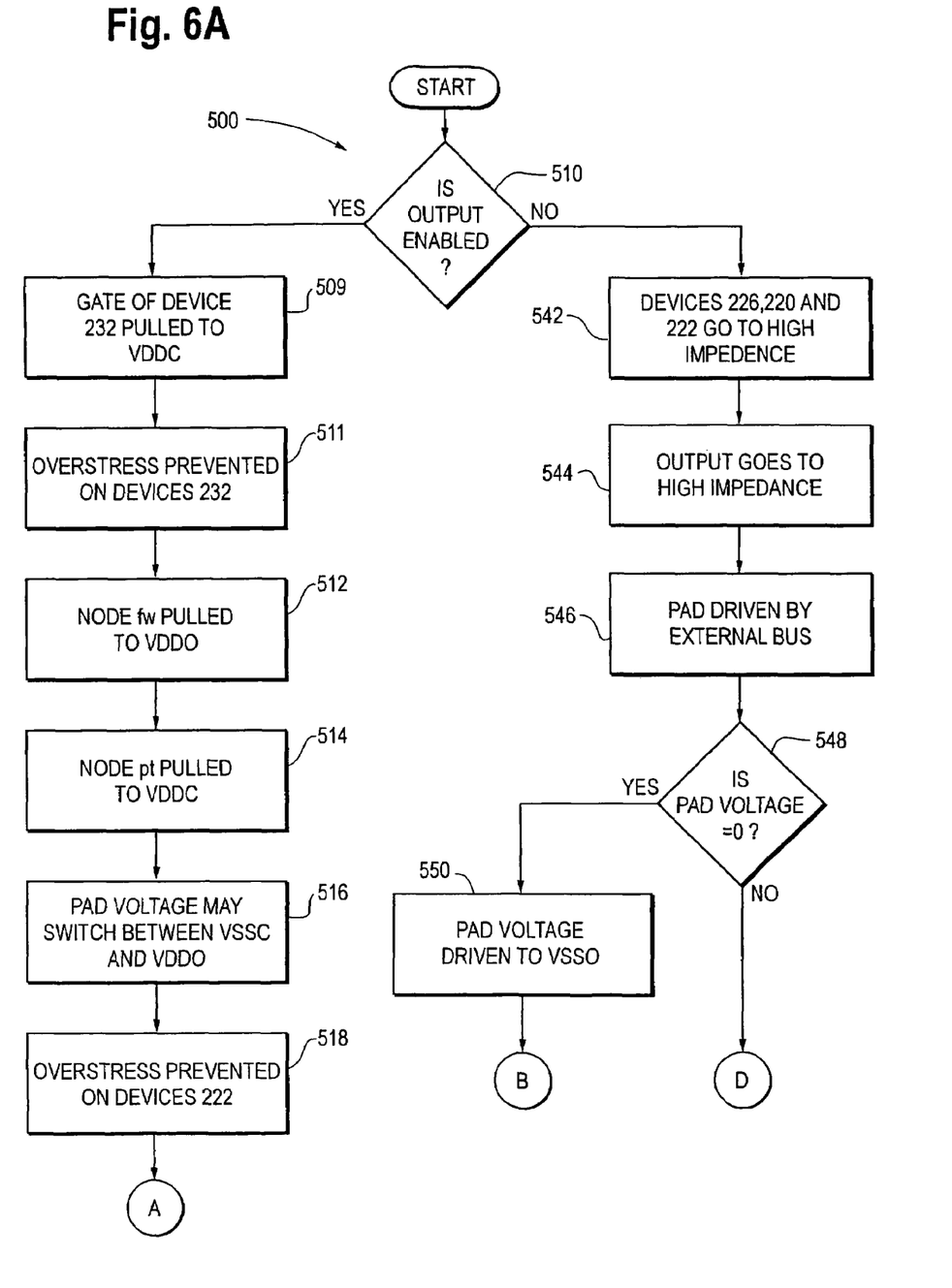
FIGS. 6A, 6B, 6C and 6D illustrate one embodiment of a detailed flow chart of one method of operating a circuit at a lower voltage than the coupled IO circuitry in accordance with the present invention.
Figure 6B:
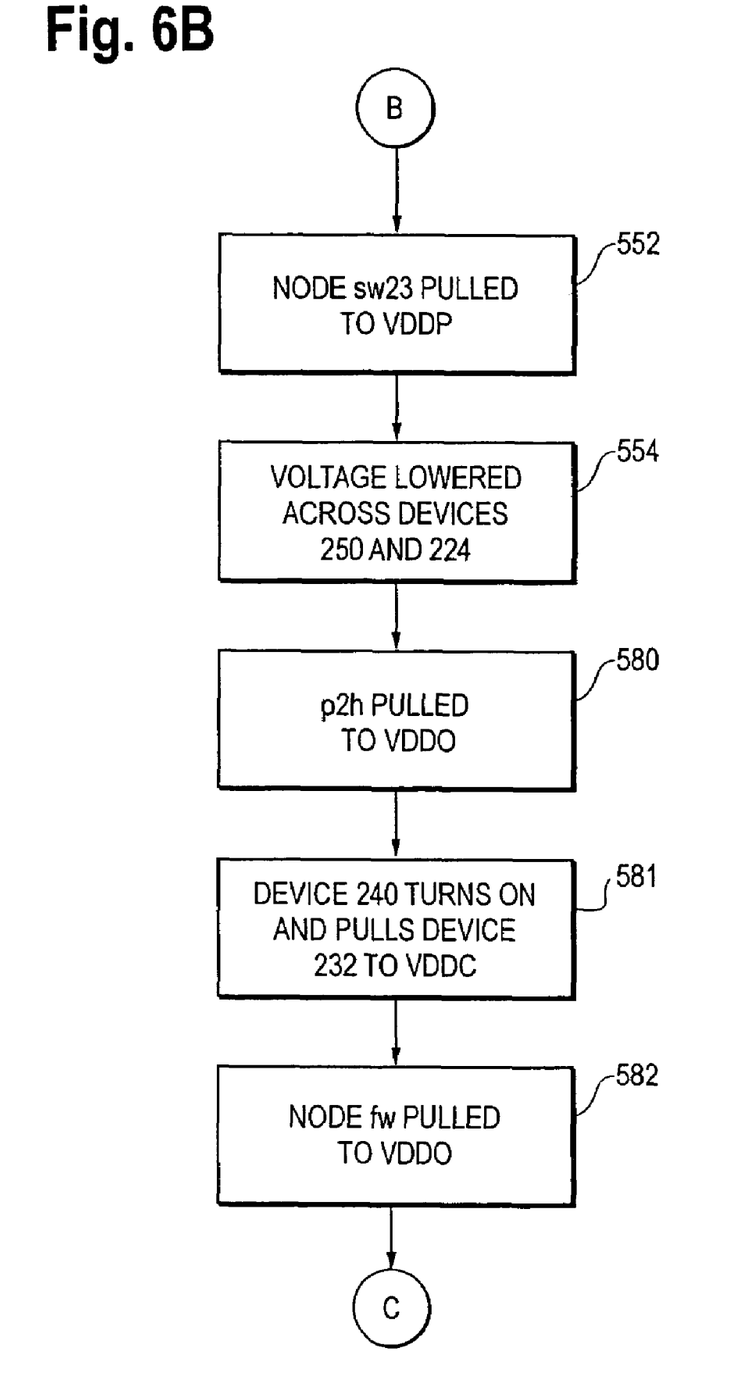
Figure 6C:
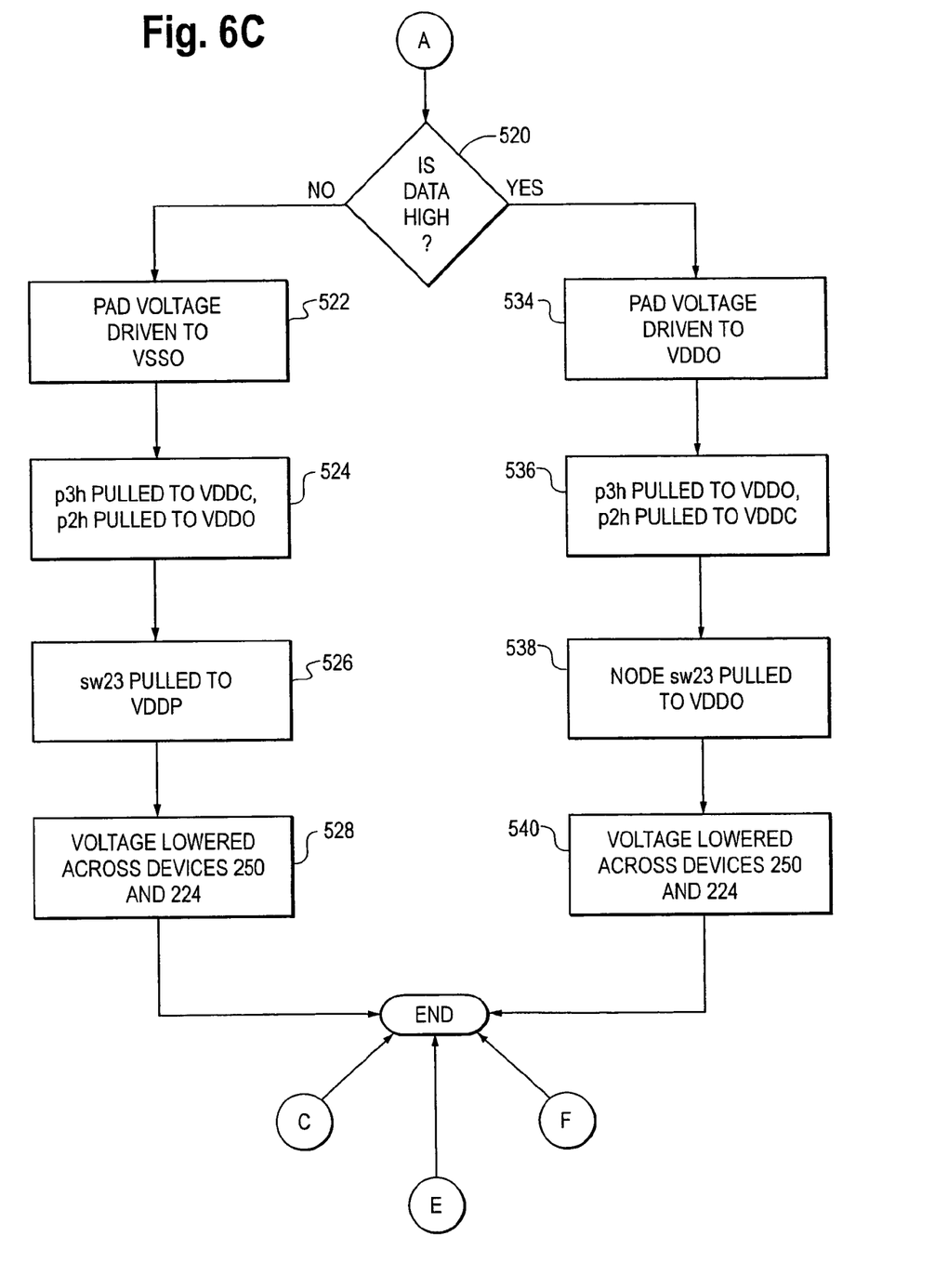
Figure 6D:
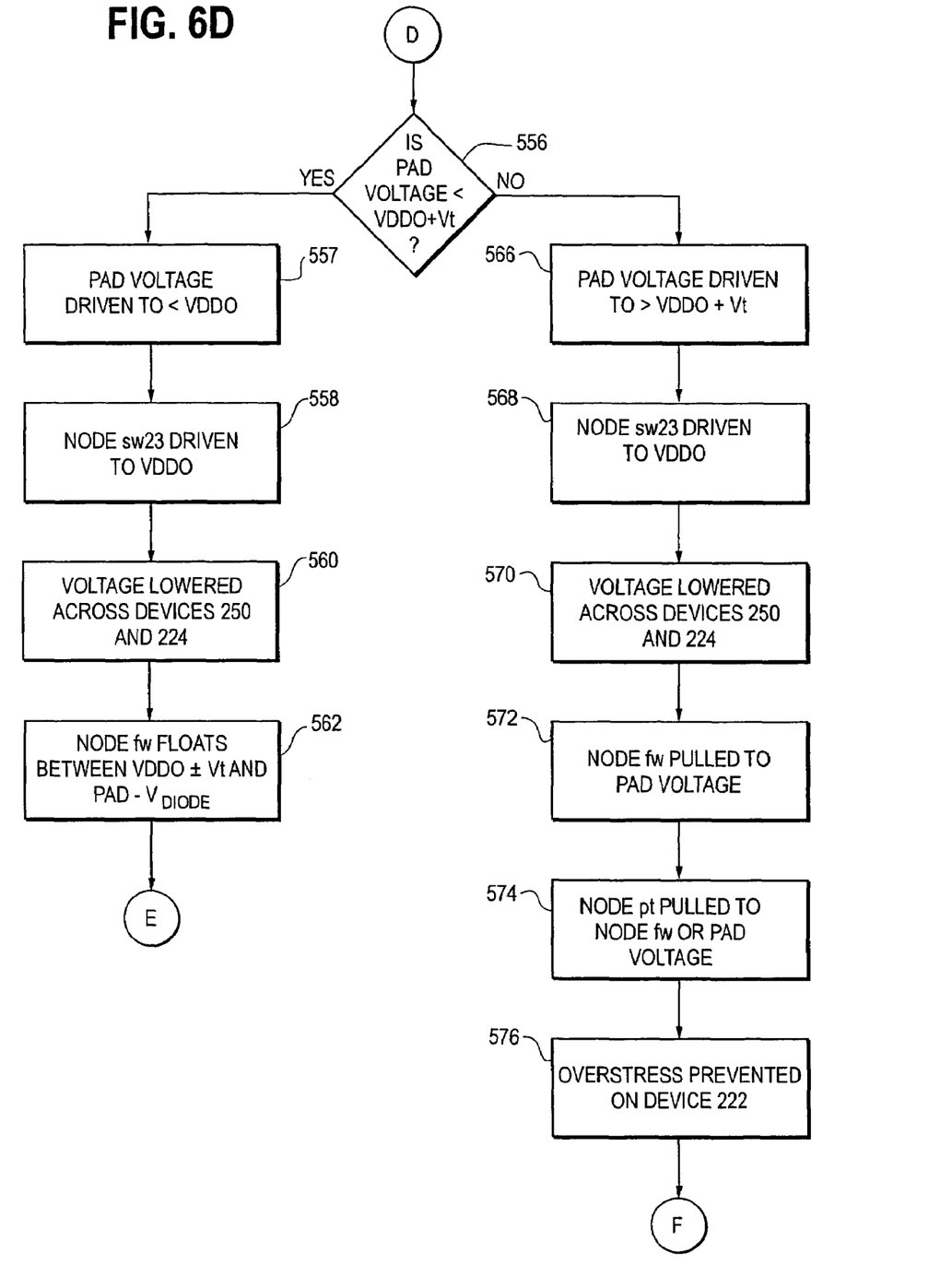

FIGS. 5A, 5B and 5C illustrate a high level flow chart depicting a method of operating a core circuit of an integrated circuit at a lower voltage than the coupled 10 circuitry using a voltage tolerant circuit (a 5V tolerant circuit for example) in accordance with the present invention, generally designated 400. The method includes determining if the output is enabled (i.e., oe=1) as illustrated by diamond 410. If oe is enabled, the PAD Voltage may switch between VSSC and VDDO without causing overstress on transistor devices 222, 224, 250. 252 and 232 as illustrated by blocks 416.

Method 400 also comprises determining if data is high (i.e., data=1) as illustrated by diamond 418. If data is not high (i.e., data=0), the PAD voltage is driven to VSSO as illustrated by block 420. The gate of transistor devices 250 and 224 are driven to VDDP, lowering the voltage across transistor devices 250 and 224 as illustrated by blocks 422.

Method 400 further comprises determining if both oe is enabled and data is high (i.e., oe=1 and data=1). When node oe is enabled and node data is high, the PAD voltage is driven to VDDO as illustrated by block 426. The gates of devices 250 and 224 are driven to VDDO, lowering the voltage across transistor devices 250 and 224 as illustrated by block 428.

Method 400 may also determine what the PAD voltage is if node oe is not enabled. Method 400 determines that, if node oe is not enabled (i.e., oe=0), the output goes to a high impedance state as illustrated by block 430 and the PAD Voltage may be driven by an external bus as illustrated by block 432. The method may also determine if node oe is not enabled and the PAD Voltage=0 as illustrated by diamond 434. When node oe is not enabled and the PAD Voltage=0, the PAD Voltage is driven to VSSO by the bus as illustrated by block 436. The gates of devices 250 and 224 are driven to VDDP, lowering the voltage across devices 250 and 224 as illustrated by block 438. The gate of device 232 is driven to VDDC, and the gate of device 222 is clamped to VDDO+/−Vt, preventing overstresss on devices 232 and 222, as illustrated by block 439.

Method 400 further comprises determining if node oe is not enabled and the PAD is high as illustrated by diamond 440. If oe=0, the bus drives the PAD voltage to <VDDO+Vt as illustrated by block 442. The gates of transistor devices 250 and 224 are driven to VDDO, lowering the voltage across devices 250 and 224 as illustrated by block 444. In this embodiment, node fw floats between VDDO±Vt due to transistor device 232 and the PAD voltage minus the forward bias voltage drop across the source to bulk diode of device 222 as illustrated by block 446.

If the PAD Voltage is not ≦VDDO+Vt in this embodiment, the bus drives the PAD voltage to >VDDO+Vt as illustrated by block 450. The gates of transistor devices 250 and 224 are driven to VDDO, lowering the voltage across devices 250 and 224 as illustrated by block 452. Node fw is pulled to the PAD voltage as illustrated by block 456. When node fw reaches VDDO+Vt, transistor device 214 turns on, pulling node pt to the voltage of node fw or the PAD Voltage as illustrated by block 458. Device 216 prevents voltage stress on device 218 and overstress is prevented on device 222 as illustrated by blocks 459 and 460.

FIGS. 6A, 6B, 6C and 6D illustrate a flow chart depicting one method of operating a core circuit of an integrated circuit at a lower voltage than the coupled IO circuitry using a voltage tolerant circuit (a 5V tolerant circuit for example) in accordance with the present invention, generally designated 500. In this embodiment, method 500 comprises determining if node oe is enabled as illustrated by diamond 510. If node oe is enabled, the gate of device 232 is pulled to VDDC as illustrated by block 509 and voltage stress is prevented on device 232 as illustrated by block 511. Node fw is pulled to VDDO as illustrated by block 512. In one embodiment, node 254 drives the gate of transistor device 238, turning device 238 on, which pulls down the gate of transistor device 232, turning device 232 on and pulling node fw equal to VDDO as illustrated by block 512. When node oe is enabled (i.e., oe=1), VDDO is the highest voltage seen by the circuit. Node pt is pulled to VDDC as illustrated by block 514. In one embodiment, node oe drives the gate of transistor device 218 turning device 218 on which pulls the node pt to VDDC. When node pt reaches VDDC, the PAD voltage may switch between VSSC and VDDO without causing overstress on transistor device 222 as illustrated by blocks 516 and 518.

Method 500 comprises determining if data is high (data=1) as illustrated by diamond 520. If data is not high, in one embodiment, transistor device 220 is off while transistor devices 224 and 226 are turned on. This drives the PAD Voltage to VSSO as illustrated by block 522.

The PAD voltage is communicated or fed back through the voltage detector 246, resulting in nodes p3h being pulled to VDDC and p2h being pulled to VDDO as illustrated by block 524. When node p3h reaches VDDC, transistor device 242 is turned on and node sw23 is pulled to VDDP as illustrated by block 526. When node sw23 reaches VDDP, the gate of transistor devices 250 and 224 are driven to VDDP, lowering the voltage across transistor devices 250 and 224 as illustrated by block 528. In one embodiment of the present invention, transistor device 252 decouples the PAD Voltage from the gate of transistor device 232 when the PAD voltage is less than VDDO+Vt.

Method 500 further comprises determining if oe is enabled and data is high (i.e., oe=1 and data=1). When node oe is enabled and data is high, transistor device 226 is off and transistor devices 220 and 222 are turned on, which drives the PAD voltage to VDDO as illustrated by block 534. The PAD voltage is communicated or fed back through the voltage detector 246, resulting in node p3h being driven to VDDO and node p2h being driven to VDDC as illustrated by block 536. Node sw23 is pulled to VDDO as illustrated by block 538. In one embodiment, when node p2h reaches VDDC, transistor device 244 is turned on and node sw23 is driven to VDDO as illustrated by block 538. When node sw23 reaches VDDO, the gates of devices 250 and 224 are driven to VDDO, lowering the voltage across transistor devices 250 and 224 as illustrated by block 540.

Method 500 further comprises determining what the PAD voltage is if node oe is not enabled. Method 500 determines that, if node oe is not enabled (i.e., oe=0), transistor devices 218 and 238 are off and transistor devices 226, 220, 222 and the output are driven to a high impedance state as illustrated by blocks 542 and 544. In this embodiment, the PAD Voltage may be driven by an external bus as illustrated by block 546.

Method 500 determines if node oe is not enabled and the PAD Voltage=0 as illustrated by diamond 548. When node oe is not enabled and the PAD Voltage=0, the PAD Voltage is driven to VSSO by the bus as illustrated by block 550. Node sw23 is driven to VDDP as illustrated by block 552. In one embodiment, the PAD voltage is communicated or fed back through the voltage detector 246 resulting in node p3h being driven to VDDC and node p2h being driven to VDDO. When node p3h reaches VDDC, transistor device 242 is turned on and node sw23 is driven to VDDP. Node sw23 drives the gates of devices 250 and 224 to VDDP, lowering the voltage across devices 250 and 224 as illustrated by block 554. Further, when node p2h is driven to VDDO, it turns on the device 240 pulling the gate of transistor device 232 low. Pulling the gate of device 232 low turns it on, pulling node fw to VDDO as illustrated in blocks 580, 581 and 582.

Method 500 further comprises determining if node oe is not enabled and the PAD Voltage <VDDO+Vt as illustrated by diamond 556. Block 557 illustrates that, when node oe is not enabled, the bus drives the PAD Voltage to <VDDO+Vt. The PAD voltage is communicated or fed back through the voltage detector 246, resulting in node p3h being driven to VDDO and node p2h being driven to VDDC. When p3h reaches VDDO, transistor device 244 is turned on and sw23 is driven to VDDO as illustrated by block 558. Node sw23 drives the gates of transistor devices 250 and 224 to VDDO, lowering the voltage across devices 250 and 224 as illustrated by block 560. In this embodiment, node fw floats between VDDO±Vt due to transistor device 232 and the drain to bulk diode, fw, of device 222 as illustrated by block 562.

If the PAD Voltage is not <VDDO+Vt, method 500 comprises determining if node oe is not enabled and the PAD Voltage >VDDO+Vt as illustrated by diamond 556. In this embodiment, the bus drives the PAD voltage to >VDDO+Vt as illustrated by block 566. The PAD voltage is communicated or fed back through the voltage detector 246, such that node p3h is driven to VDDO and node p2h is driven to VDDC. When node p3h reaches VDDO, transistor device 244 is turned on and node sw23 is driven to VDDO as illustrated by block 568. Node sw23 drives the gates of transistor devices 250 and 224 to VDDO, lowering the voltage across devices 250 and 224 as illustrated by block 570. Transistor device 252 turns on as the PAD Voltage is at >VDDO+Vt and the gate of device 252 is at VDDO, which pulls the gate of transistor device 232 to the PAD voltage, turning it off and device 234 on, pulling node fw to the PAD voltage as illustrated by block 572. When node fw reaches VDDO+Vt, transistor device 214 turns on, pulling node pt to the voltage of node fw or the PAD Voltage as illustrated by block 574. This prevents voltage stress on device 222 as illustrated by block 576.

Another advantage of an exemplary embodiment of the present invention comprising tri-stating the PMOS driver is that HCI may be significantly reduced when the output transitions from dissabled to enabled with the pad at 5.5V and the data is low. For example, if the pad is at 5.5V and the enable goes from low to high, with the data low, there will be a very large Vds on devices 224 and 226 resulting in possible HCI stress since 224 and 226 are on. In accordance with the present invention, node pt pulls low and device 222 is turned on when the output is enabled. Since the PAD voltage is greater than VDDO, device 220 is also on, dissipating some of the charge through devices 222 and 220. Since s23 is at VDDO, device 224 is not stressed even when the pad is at 5.5V.

It is contemplated that the tolerant circuit, the integrated circuit including at least a tolerant circuit and a method of operating a core circuit of an integrated circuit at a lower voltage than the coupled IO circuitry using a tolerant circuit in accordance with the present invention provides/includes one or more of the following advantages and features: (1) enables lower power higher speed and more efficient design of core/analog while still utilizing 5V tolerant IOs; (2) simplifies fabrication process and cost as three gate oxides may no longer be needed for optimum performance and 5V tolerance; and (3) reduces HCI stress on the NMOS output driver; and (4) allows the use of the more efficient 2.5V device, while still enabling the output pad to be driven by a 5V bus One embodiment eliminates the tri-state circuit 212 and ties node pt to the gate of device 232.

Many modifications and variations of the present invention are possible in light of the above teachings. Thus, it is to be understood that, within the scope of the appended claims, the invention may be practiced otherwise than as described hereinabove.

The invention claimed is:

1. A method of operating an integrated circuit using a voltage tolerant circuit comprising:
    a step of detecting when a voltage is sufficient to switch bias conditions without violating maximum transistor operating conditions;
    a step of detecting when a PAD voltage is greater than an IO power supply voltage; and
    decoupling said PAD voltage when said PAD voltage is less than a voltage of a core power supply plus a threshold voltage of a voltage detect module.

2. The method of claim 1 comprising a step of switching between an intermediate power voltage and an IO power voltage.

3. The method of claim 1 comprising a step of ensuring that a PMOS transistor device will not turn on when said PAD voltage exceeds said IO power supply voltage.

4. The method of claim 1 comprising a step of preventing at least one transistor device from being overstressed.

5. The method of claim 1 comprising a step of preventing overstress when a voltage of a floating well is greater than said PAD voltage.

6. The method of claim 1 comprising a step of preventing overstress when a voltage of a floating well is greater than said IO power supply voltage.

7. A method of operating an integrated circuit using a voltage tolerant circuit comprising:
    a step of detecting when a voltage is sufficient to switch bias conditions without violating maximum transistor operating conditions using a voltage detect module of the voltage tolerant circuit;
    a step of detecting when a PAD voltage is greater than an IO power supply voltage using a comparator of said voltage detect module; and
    a step of switching between an intermediate power voltage and an IO power supply voltage using a switching transistor device.

8. The method of claim 7, wherein said comparator comprises at least one device.

9. The method of claim 7, wherein said comparator comprises two PMOS transistor device.

10. The method of claim 7 comprising a step of ensuring that a PMOS transistor device will not turn on when said PAD voltage exceeds said IO power supply voltage using a tri-state module.

11. The method of claim 10, wherein said tri-state module comprises at least one device.

12. The method of claim 10, wherein said tri-state module comprises at least one PMOS transistor device.

13. The method of claim 10, wherein said tri-state module comprises at least one NMOS transistor device.

14. The method of claim 7 comprising a step of preventing at least one transistor device from being overstressed using an overstress module.

15. The method of claim 14, wherein said overstressed module comprises at least one device.

16. The method of claim 14, wherein said overstressed module comprises three NMOS transistor devices.

17. The method of claim 14 comprising a step of preventing said overstress when a voltage of a floating well is greater than said PAD voltage using said overstress module.

18. The method of claim 14 comprising a step of preventing said overstress when a voltage of a floating well is greater than said IO power supply voltage using said overstress module.

19. The method of claim 7 comprising a step of switching between an intermediate power voltage and an IO power voltage using a switching transistor.

20. The method of claim 7 comprising decoupling said PAD Voltage from at least one device in said comparator when said PAD voltage is less than a predetermined voltage using a transistor device.

21. The method of claim 20 wherein said predetermined voltage comprises a voltage of a core power supply plus a threshold voltage of said voltage detect module.

* * * * *